(12) United States Patent
Haba et al.

(10) Patent No.: US 9,330,954 B2
(45) Date of Patent: May 3, 2016

(54) SUBSTRATE-TO-CARRIER ADHESION WITHOUT MECHANICAL ADHESION BETWEEN ABUTTING SURFACES THEREOF

(71) Applicant: Invensas Corporation, San Jose, CA (US)

(72) Inventors: Belgacem Haba, Saratoga, CA (US); Ilyas Mohammed, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 97 days.

(21) Appl. No.: 14/087,114

(22) Filed: Nov. 22, 2013

(65) Prior Publication Data

US 2015/0145140 A1  May 28, 2015

(51) Int. Cl.
*H01L 21/48* (2006.01)
*H01L 21/683* (2006.01)
*H01L 23/522* (2006.01)

(52) U.S. Cl.
CPC ........ *H01L 21/6835* (2013.01); *H01L 21/6836* (2013.01); *H01L 23/5226* (2013.01); *H01L 2221/6834* (2013.01); *H01L 2221/68327* (2013.01); *H01L 2224/11* (2013.01); *H01L 2224/16145* (2013.01); *H01L 2224/16225* (2013.01); *H01L 2224/73204* (2013.01); *H01L 2224/73253* (2013.01); *H01L 2924/0002* (2013.01); *H01L 2924/15311* (2013.01)

(58) Field of Classification Search
CPC ..... H01L 21/67; H01L 21/68; H01L 21/6836; H01L 21/8221
See application file for complete search history.

(56) References Cited

U.S. PATENT DOCUMENTS

| | | | |
|---|---|---|---|
| 3,976,288 A * | 8/1976 | Cuomo, Jr. ..................... 269/21 |
| 6,698,416 B1 * | 3/2004 | Roberts ....................... 125/13.01 |
| 6,924,210 B1 * | 8/2005 | Daubenspeck et al. ........ 438/460 |
| 7,737,003 B2 * | 6/2010 | DeMulder et al. ............. 438/464 |
| 8,647,963 B2 * | 2/2014 | Lee et al. ...................... 438/458 |
| 2002/0123210 A1 * | 9/2002 | Liu ............................... 438/459 |
| 2007/0281443 A1 * | 12/2007 | Furui ............................ 438/460 |

* cited by examiner

*Primary Examiner* — Michael Lebentritt

(57) ABSTRACT

Wafer to carrier adhesion without mechanical adhesion for formation of an IC. In such formation, an apparatus has a bottom surface of a substrate abutting a top surface of a support platform without adhesive therebetween. A material is disposed around the substrate and on the top surface of the support platform. The material is in contact with a side surface of the substrate to completely seal an interface as between the bottom surface of the substrate and the top surface of the support platform to retain abutment of the top surface and the bottom surface.

8 Claims, 8 Drawing Sheets

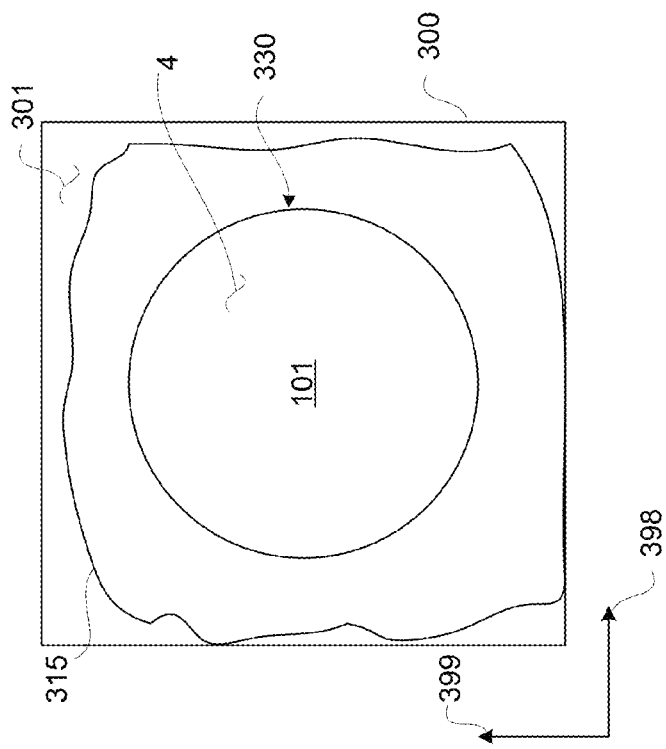
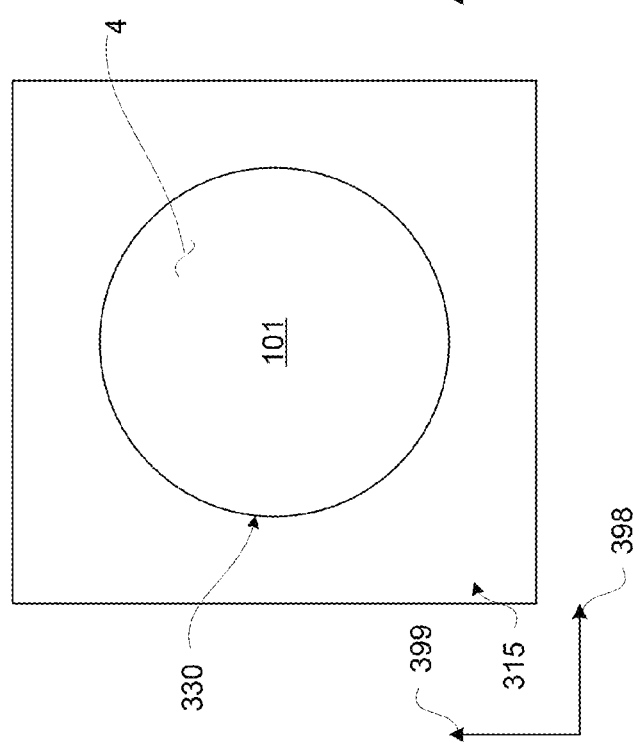
FIG. 3D-1
FIG. 3D-2

SUBSTRATE-TO-CARRIER ADHESION WITHOUT MECHANICAL ADHESION BETWEEN ABUTTING SURFACES THEREOF

FIELD

The following description relates to integrated circuits ("ICs"). More particularly, the following description relates to substrate-to-carrier adhesion without mechanical adhesion between abutting surfaces thereof for formation of an IC.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

Thinning of dies may be to address a demand for smaller packages, such as for portable communications devices, memory cards, smart cards, portable computing, or the like. However, with increasing wafer diameters, a thicker wafer has been used in order to withstand semiconductor manufacturing. Such thick wafers for semiconductor manufacturing and contrasting desire for thinner dies has led to whole wafer thinning at the back end of the line, namely after completion of processing on a front side of a wafer. Conventionally, wafer thinning involves mechanical grinding, chemical mechanical polishing ("CMP"), wet etching, and/or dry etching.

A wafer may be attached to a transparent platform or carrier. Such carrier may be transparent with respect to light. For example, a wafer may be glued to a glass carrier with use of a photo-releasable adhesive, and then lapped to a desired thickness for thinning. After lapping, a light is shined through such glass carrier in order to effectively cause such photo-releasable adhesive to release such wafer from such carrier. Unfortunately, often a portion of such photo-releasable adhesive sticks to such wafer in an area or areas of one or more dies. Because such wafer has already been thinned, removal of such photo-releasable adhesive without catastrophic damage to one or more formed dies of such wafer may not be possible.

Another approach to removal of an adhesive between a wafer and a carrier may include forming through holes in the carrier for injection of an acid or other adhesive releasing agent. However, use of a releasing agent may likewise not completely remove an adhesive from a wafer.

Accordingly, it would be desirable and useful to avoid one or more of the above-identified limitations in order to increase die per wafer yield.

BRIEF SUMMARY

Substrate-to-carrier adhesion without mechanical adhesion between abutting surfaces thereof for formation of an IC is disclosed.

An apparatus relates generally to a substrate. In such an apparatus, a bottom surface of the substrate abuts a top surface of a support platform without adhesive therebetween. A material is disposed around the substrate and on the top surface of the support platform. The material is in contact with a side surface of the substrate to completely seal an interface as between the bottom surface of the substrate and the top surface of the support platform to retain abutment of the top surface and the bottom surface.

An apparatus relates generally to another substrate. In such an apparatus, a membrane is disposed at least between a bottom surface of the substrate and a top surface of a support platform without adhesive therebetween for attachment to the bottom surface of the substrate. A material is disposed around the substrate and on a top surface of the membrane. The material seals an interface as between the bottom surface of the substrate and the top surface of the membrane to retain abutment of the bottom surface to the membrane and the support platform in combination.

A method relates generally to processing a substrate. In such a method, the substrate is placed on a top surface of a support platform. A bottom surface of the substrate abuts the top surface of the support platform after placement without adhesive between the bottom surface and the top surface. A material is deposited over and around the substrate and on the top surface of the support platform. The material is in contact with a side surface of the substrate to completely seal an interface as between the bottom surface of the substrate and the top surface of the support platform to retain abutment of the top surface and the bottom surface. An upper portion of the material is removed. The substrate is thinned including removing more of the material. The substrate is diced to provide dies.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 3D-1 is a block diagram depicting a top view of a wafer after thinning at FIG. 3C.

FIG. 3D-2 is a block diagram depicting another top view of a wafer after thinning at FIG. 3C.

FIG. 3E-1 is a block diagram depicting a wafer or substrate after having completed BEOL processing and dicing for a dicing operation.

FIG. 3E-2 is a block diagram depicting a wafer or substrate after completed BEOL processing and partial dicing for a dicing operation.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1A:
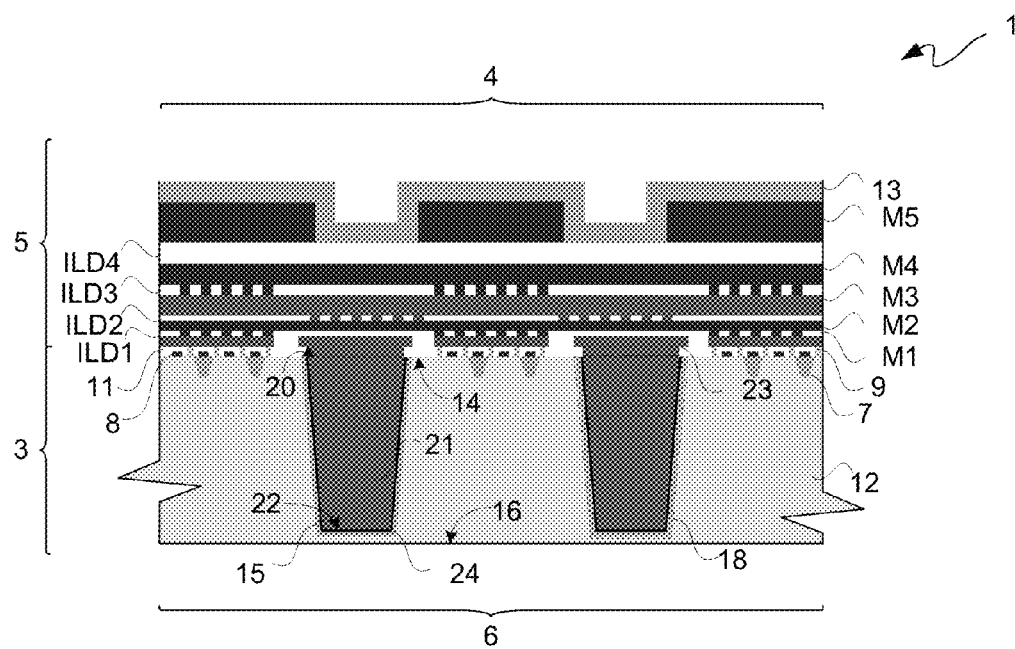
FIG. 1A is a schematic diagram of a cross-sectional view depicting an exemplary portion of an in-process wafer for providing an integrated circuit ("IC").

FIG. 1A is a schematic diagram of a cross-sectional view depicting an exemplary portion of an in-process wafer for providing an IC 10 component. IC 10 includes a substrate 12 of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate 12 as provided from an in-process wafer is generally described below, any sheet or layer semiconductor material or dielectric material, such as ceramic or glass for example, may be used as a substrate. Furthermore, even though an IC 10 is described, any microelectronic component that includes one or more through-substrate via structures may be used.

Substrate 12 includes an upper surface 14 and a lower surface 16 that extend in lateral directions and are generally parallel to each other at a thickness of substrate 12. Use of terms such as "upper" and "lower" or other directional terms is made with respect to the reference frame of the figures and is not meant to be limiting with respect to potential alternative orientations, such as in further assemblies or as used in various systems.

Upper surface 14 may generally be associated with what is referred to as a "front side" 4 of an in-process wafer, and lower surface 16 may generally be associated with what is referred to as a "backside" 6 of an in-process wafer. Along those lines, a front-side 4 of an in-process wafer may be used for forming what is referred to as front-end-of-line ("FEOL") structures 3 and back-end-of-line ("BEOL") structures 5. Generally, FEOL structures 3 may include shallow trench isolations ("STI") 7, transistor gates 8, transistor source/drain regions (not shown), transistor gate dielectrics (not shown), contact etch stop layer ("CESL"; not shown), a pre-metallization dielectric or pre-metal dielectric ("PMD") 11, and contact plugs 9, among other FEOL structures. A PMD 11 may be composed of one or more layers. Generally, BEOL structures 5 may include one or more inter-level dielectrics ("ILDs") and one or more levels of metallization ("M"). In this example, there are four ILDs, namely ILD1, ILD2, ILD3, and ILD4; however, in other configurations there may be fewer or more ILDs. Furthermore, each ILD may be composed of one or more dielectric layers. In this example, there are five levels of metallization, namely M1, M2, M3, M4, and M5; however, in other configurations there may be fewer or more levels of metallization. Additionally, metal from a metallization level may extend through one or more ILDs, as is known. Furthermore, each level of metallization may be composed of one or more metal layers. A passivation level 13 may be formed on a last metallization layer. Such passivation level 13 may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide layer for example; another metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

As part of a FEOL or BEOL structure formation, a plurality of via structures 18 may extend within openings formed in substrate 12 which extend into substrate 12. Via structures 18 may be generally in the form of any solid of any shape formed by filling an opening formed in substrate 12. Examples of such solid shapes generally include cylindrical, conical, frustoconical, rectangular prismatic, cubic, or the like.

Conventionally, via structures 18 may extend from upper surface 14 down toward lower surface 16, and after a backside reveal, via structures 18 may extend between surfaces 14 and 16, as effectively thickness of substrate 12 may be thinned so as to reveal lower end surfaces of via structures 18, as described below in additional detail. Via structures 18 extending through substrate 12 between surfaces 14 and 16, though they may extend above or below such surfaces, respectively, may be referred to as through-substrate-vias. As substrates are often formed of silicon, such through-substrate-vias are commonly referred to as TSVs, which stands for through-silicon-vias.

Such openings formed in substrate 12 may be conformally coated, oxidized, or otherwise lined with a liner or insulator 15. Conventionally, liner 15 is silicon dioxide; however, a silicon oxide, a silicon nitride, or another dielectric material may be used to electrically isolate via structures 18 from substrate 12. Generally, liner 15 is an insulating or dielectric material positioned between any and all conductive portions of a via structure 18 and substrate 12 such that an electronic signal, a ground, a supply voltage, or the like carried by such via structure 18 is not substantially leaked into substrate 12, which may cause signal loss or attenuation, shorting, or other circuit failure.

Overlying a liner 15 may be a barrier layer 24. Generally, barrier layer 24 is to provide a diffusion barrier with respect to a metallic material used to generally fill a remainder of an opening in which a via structure 18 is formed. Barrier layer 24 may be composed of one or more layers. Furthermore, a barrier layer 24 may provide a seed layer for subsequent electroplating or other deposition, and thus barrier layer 24 may be referred to as a barrier/seed layer. Moreover, barrier layer 24 may provide an adhesion layer for adherence of a subsequently deposited metal. Thus, barrier layer 24 may be a barrier/adhesion layer, a barrier/seed layer, or a barrier/adhesion/seed layer. Examples of materials that may be used for barrier layer 24 include tantalum (Ta), tantalum nitride (TaN), palladium (Pd), titanium nitride (TiN), TaSiN, compounds of Ta, compounds of Ti, compounds of Nickel (Ni), compounds of Copper (Cu), among others.

Via structures 18 may generally consist of a metallic or other conductive material generally filling a remaining void in an opening formed in substrate 12 to provide a via conductor 21. In various examples, a via conductor 21 of a via structure 18 may generally consist of copper or a copper alloy. However, a via conductor 21 may additionally or alternatively include one or more other conductive materials such as tantalum, nickel, titanium, molybdenum, tungsten, aluminum, gold, or silver, including various alloys or compounds of one or more of the these materials, and the like. A via conductor 21 may include non-metallic additives to control various environmental or operational parameters of a via structure 18.

Via structures 18 may each include an upper end contact surface 20 which may be level with upper surface 14 of substrate 12 and a lower end contact surface 22 which may be level with lower surface 16 of substrate 12 after a backside reveal. End surfaces 20 and 22 may be used to interconnect via structures 18 with other internal or external components, as below described in additional detail.

In this example, upper end contact surface 20 of via conductors 21 are interconnected to M1 through a respective contact pad 23. Contact pads 23 may be formed in respective openings formed in PMD 11 in which M1 extends. However, in other configurations, one or more via conductors 21 may extend to one or more other higher levels of metallization through one or more ILDs. Furthermore, via structure 18 is what may be referred to as a front side TSV, as an opening used to form via structure is initially formed by etching from a front side of substrate 12.

Figure 1B:
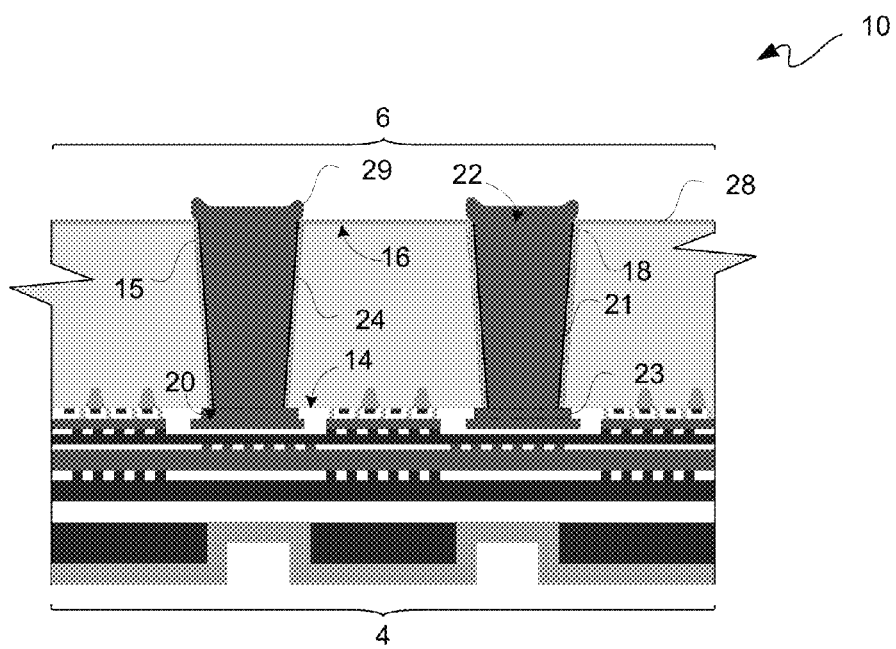
FIG. 1B is a schematic diagram of a cross-sectional view depicting an exemplary portion of an in-process wafer for providing another IC.

However, a via structure may be a backside TSV, as generally indicated in FIG. 1B, where there is shown a schematic diagram of a cross-sectional view depicting an exemplary portion of an in-process wafer for providing another IC 10. Fabrication of a backside TSV is generally referred to as a "via last approach," and accordingly fabrication of a front side TSV is generally referred to as a "via first approach."

IC 10 of FIG. 1B includes a plurality of via structures 18, which are backside TSVs. For a backside TSV for via structure 18, liner 15 may be a deposited polymer into a "donut" silicon trench etch and deposited on lower surface 16 as a passivation layer 28, followed by a central silicon trench etch to remove an inner portion of the "donut" silicon trench, and followed by a seed layer deposition before patterning and electroplating to provide via conductors 21 having respective solder bump pads or landings 29. Optionally, a conventional anisotropic silicon etch may be used prior to depositing and patterning a polymer isolation layer as liner 15.

For purposes of clarity by way of example and not limitation, it shall be assumed that front side TSVs are used, as the following description is generally equally applicable to backside TSVs.

Figure 1C:
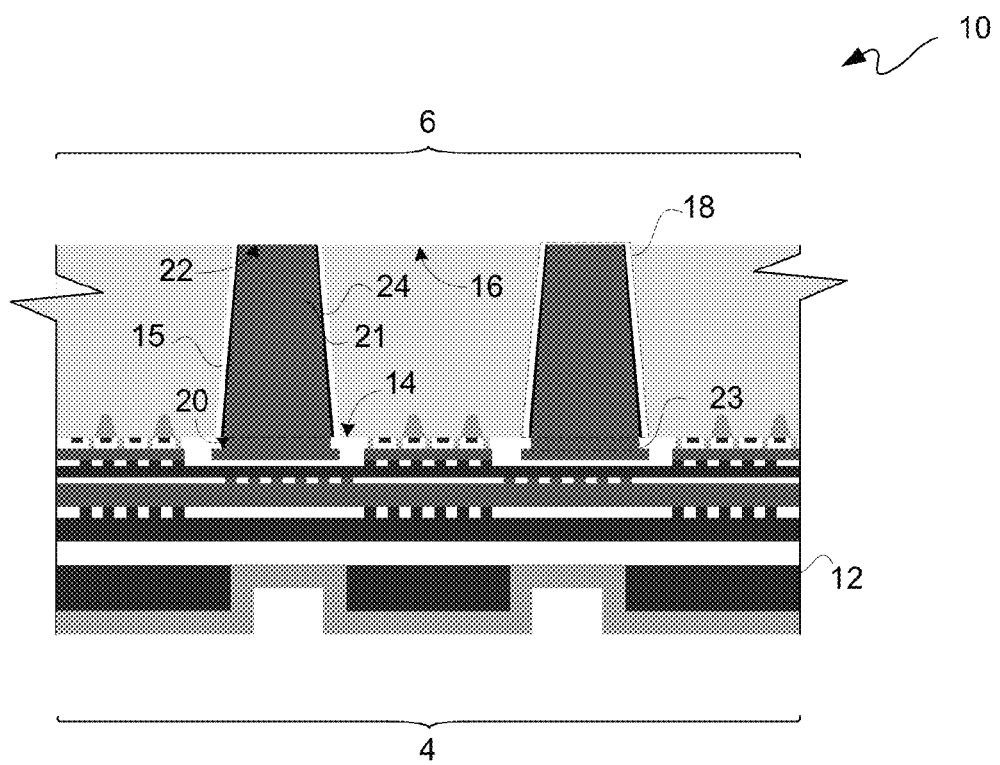
FIG. 1C is the diagram of FIG. 1A with the IC vertically flipped after chemical-mechanical-polishing of a lower surface of a substrate of the IC.

FIG. 1C is the diagram of FIG. 1A with IC 10 after a chemical-mechanical-polishing ("CMP") of a lower surface 16 of a substrate 12. Such CMP may be performed to temporarily reveal lower end contact surface 22, and thus portions of liner 15 and barrier layer 24 previously underlying lower end contact surface 22 may be removed by CMP. Thus, in this example, lower end contact surface 22 may be coplanar and level with lower surface 16.

Figure 1D:
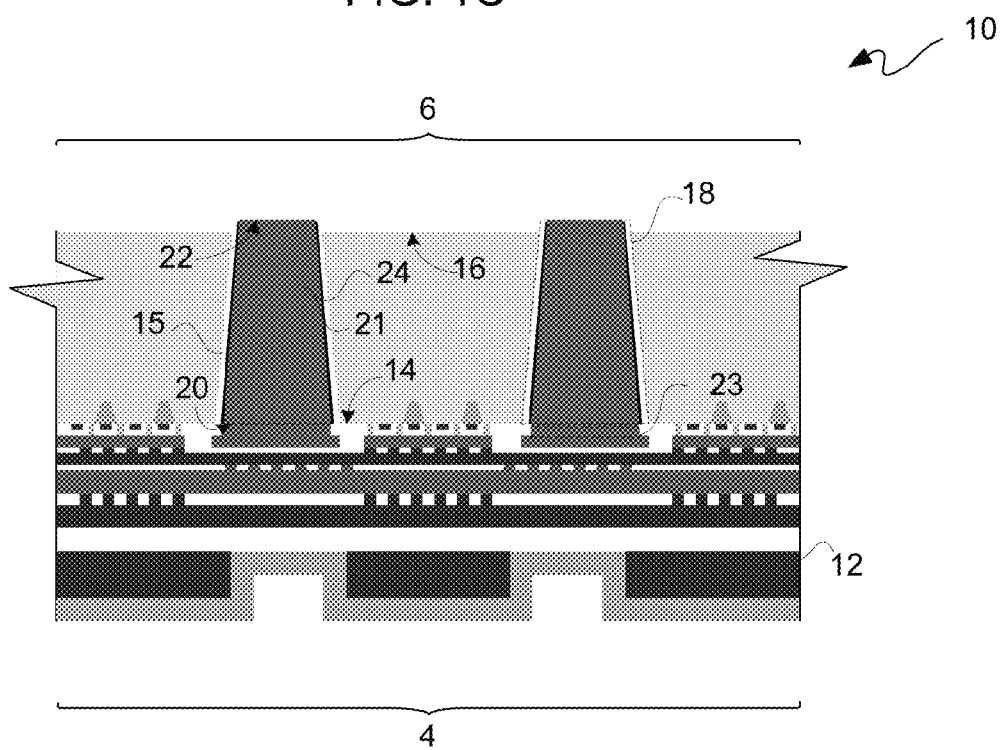
FIG. 1D is the diagram of FIG. 1A with the IC vertically flipped after a backside etch of a lower surface of a substrate of the IC to reveal a lower end contact surface of a via conductor thereof.

FIG. 1D is the diagram of FIG. 1A with IC 10 after a backside etch of a lower surface 16 of substrate 12 to temporarily reveal a lower end contact surface 22 of a via conductor 21. In this example, lower end contact surface 22 may be coplanar with lower surface 16; however, as via conductor 21, and optionally barrier layer 24, may protrude from substrate 12 after a backside reveal etch, lower end contact surface 22 in this example is not level with lower surface 16. For purposes of clarity and not limitation, IC 10 of FIG. 1D shall be further described, as the following description may likewise apply to IC 10 of FIG. 1C.

Figure 1E:
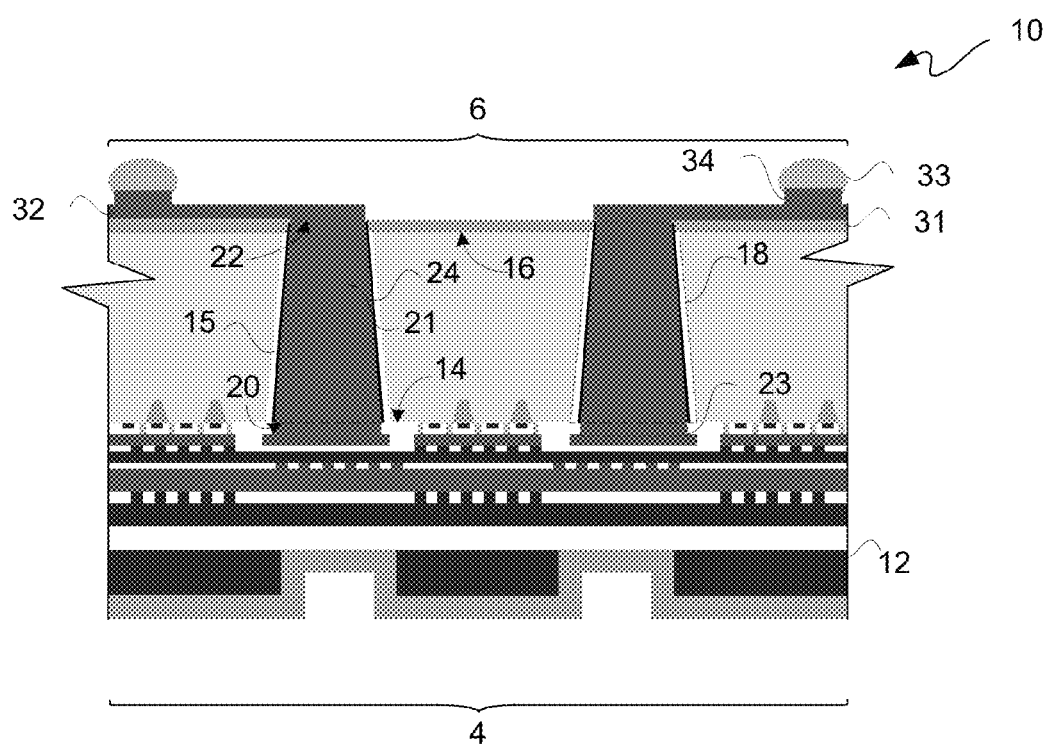
FIG. 1E is the diagram of FIG. 1D with a lower surface of the IC having formed thereon a passivation layer, which may be formed of one or more dielectric layers.

FIG. 1E is the diagram of FIG. 1D with a lower surface 16 of a substrate 12 having formed thereon a passivation layer 31, which may be formed of one or more dielectric layers. Furthermore, passivation layer 31 may be a polymer layer. For example, passivation layer 31 may be a benzocyclobutene ("BOB") layer or a combination of a silicon nitride layer and a BCB layer. In some applications, passivation layer 31 may be referred to as an inter-die layer. A metal layer 32, such as a copper, copper alloy, or other metal previously described, may be formed on passivation layer 31 and on lower end contact surfaces 22 of via conductors 21. This metal layer 32 may be an RDL metal layer. Balls 33 may be respectively formed on bonding pads 34, where such pads may be formed on or as part of metal layer 32. Balls 33 may be formed of a bonding material, such as solder or other bonding material. Balls 33 may be microbumps, C4 bumps, ball grid array ("BGA") balls, or some other die interconnect structure. In some applications, metal layer 32 may be referred to as a landing pad.

More recently, TSVs have been used to provide what is referred to as three-dimensional ("3D") ICs or "3D ICs." Generally, attaching one die to another using, in part, TSVs may be performed at a bond pad level or an on-chip electrical wiring level. ICs 10 may be diced from a wafer into single dies. Such single dies may be bonded to one another or bonded to a circuit platform, as previously described. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components. In other examples, one or more RDLs may be formed as part of such interposer on one or more sides thereof and connected with one or both ends of such vias. An RDL may include numerous conductive traces extending on or within one or more dielectric sheets or layers. Such traces may be provided in one level or in multiple levels throughout a single dielectric layer, separated by portions of dielectric material within such RDL. Vias may be included in an RDL to interconnect traces in different levels of such RDL.

Figure 2A:
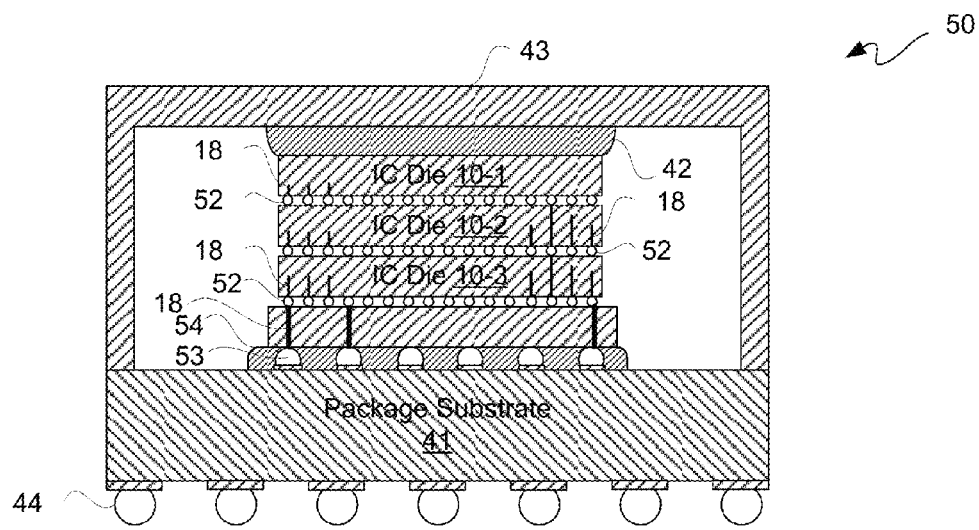
FIG. 2A is a block diagram of a cross-sectional view depicting an exemplary three-dimensional ("3D") IC packaged component with via structures.

FIG. 2A is a block diagram of a cross-sectional view depicting an exemplary 3D IC packaged component 50 with via structures 18. While a stacked die or a package-on-package die may include TSV interconnects, use of via structures 18 for a 3D IC packaged component 50 is described for purposes of clarity by way of example. In this example of a 3D IC packaged component 50, there are three ICs 10, namely ICs 10-1, 10-2, and 10-3, stacked one upon the other. In other implementations, there may be fewer or more than three ICs 10 in a stack. ICs 10 may be bonded to one another using microbumps 52 or flip-chip solder bumps. Optionally, Cu pillars extending from a backside of a die may be used. Some of these microbumps 52 may be interconnected to via structures 18. For example, a Cu/Sn microbump transient liquid phase ("TLP") bonding technology may be used for bonding ICs to one another. Thus, interconnect layers may be on one upper or lower side or both upper and lower sides of an IC 10 of a 3D stack.

A bottom IC 10-3 of such ICs in a 3D stack optionally may be coupled to an interposer or interposer die 40. Interposer 40 may be an active die or a passive die. For purposes of clarity and not limitation, it shall be assumed that interposer 40 is a passive die. IC 10-3 may be coupled to interposer 40 by microbumps 52. Interposer 40 may be coupled to a package substrate 41. Package substrate 41 may be formed of thin layers called laminates or laminate substrates. Laminates may be organic or inorganic. Examples of materials for "rigid" package substrates include an epoxy-based laminate such as FR4, a resin-based laminate such as bismaleimide-triazine ("BT"), a ceramic substrate, a glass substrate, or other form of package substrate. An under fill 54 for a flip chip attachment may encapsulate C4 bumps or other solder balls 53 used to couple interposer 40 and package substrate 41. A spreader/heat sink ("heat sink") 43 may be attached to package substrate 41, and such heat sink 43 and substrate package 41 in combination may encase ICs 10 and interposer 40 of such 3D stack. A thermal paste 42 may couple an upper surface of IC 10-1 on top of such 3D stack to an upper internal surface of such heat sink 43. Ball grid array ("BGA") balls or other array interconnects 44 may be used to couple package substrate 41 to a circuit platform, such as a PCB for example.

Figure 2B:
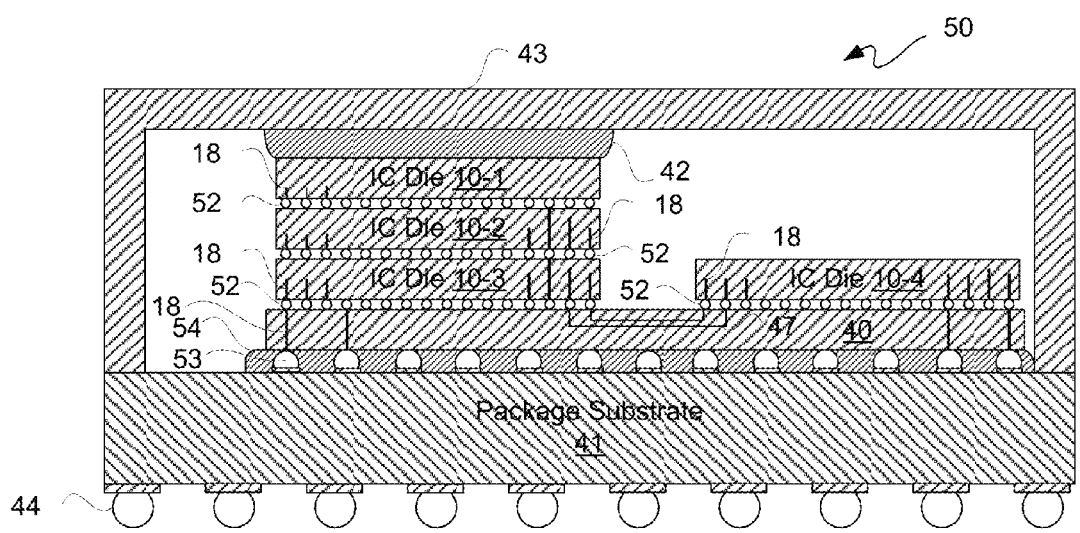
FIG. 2B is a block diagram of a cross-sectional view depicting another exemplary 3D IC packaged component with via structures.

FIG. 2B is a block diagram of a cross-sectional view depicting another exemplary 3D IC packaged component 50 with via structures 18. 3D IC packaged components 50 of FIGS. 2A and 2B are the same except for the following differences; in FIG. 2B, another IC 10-4 is separately coupled via microbumps 52 to interposer 40, where IC 10-4 is not coupled in the stack of ICs 10-1, 10-2, and 10-3. Furthermore, interposer 40 includes metal and via layers for providing wires 47 for interconnecting ICs 10-3 and 10-4. Furthermore, interposer 40 includes via structures 18 coupled to IC 10-4 through microbumps 52.

3D wafer-level packaging ("3D-WLP") may be used for interconnecting two or more ICs, one or more ICs to an interposer, or any combination thereof, where interconnects thereof may use via structures 18. Optionally, ICs may be interconnected die-to-die ("D2D") or chip-to-chip ("C2C"), where interconnects thereof may use via structures 18. Further, optionally, ICs may be interconnected die-to-wafer ("D2W") or chip-to-wafer ("C2W"), where interconnects thereof may use via structures 18. Accordingly, any of a variety of die stacking or chip stacking approaches may be used to provide a 3D stacked IC ("3D-SIC" or "3D-IC").

While thinning of wafers may be used to thin dies having a fabricated multi-layered structure ("substrate") with generally any and all BEOL and FEOL processing operations having been completed generally for providing an IC 10, as described below such thinning may occur prior to FEOL processing or prior to BEOL processing with respect to a passive die. In passive die configurations, such as a passive interposer for example, there may not be any FEOL processing operations. As used above, a substrate 12 of FIG. 1A for example was a single layer. However, more generally a substrate may be a single layer or multiple layers used to form a passive or active component. Along those lines, a semiconductor die may be referred to as a substrate.

As described below in additional detail, a wafer and carrier combination may travel together through an entire semiconductor process flow for forming dies, whether active or passive, on such wafer. Even though such combination of wafer and carrier as described below may employed for wafer thinning after formation of any and all FEOL and BEOL processing has been completed, the following description is in terms of thinning a bare wafer. Thinning prior to BEOL processing may avoid damage to such BEOL formed structures.

Figure 3A:
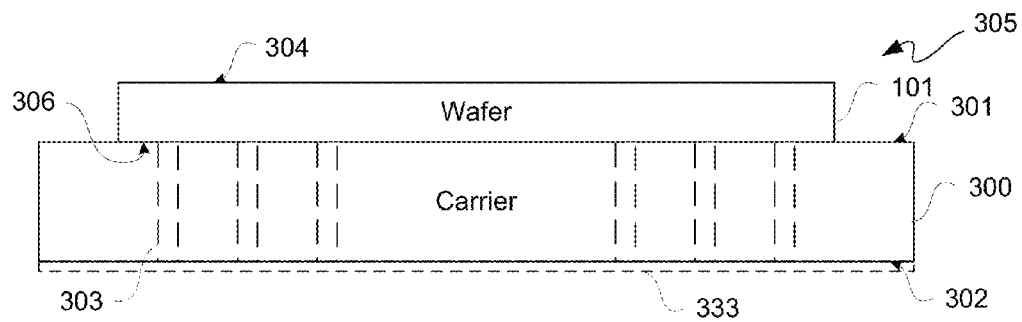
FIG. 3A is a block diagram depicting a side view of an exemplary substrate and support platform ("carrier").

Along the above lines, FIG. 3A is a block diagram depicting a side view of an exemplary substrate 101 and support platform ("carrier") 300. Even though substrate 101 is generally described as being a lightly doped silicon wafer conventionally used for forming ICs, namely wafer 101, and before any FEOL processing, wafer 101 may be any material that may be used to provide a substrate. Along those lines, even though wafer 101 is generally described as a "bare wafer" having a cylindrical or circular shape, wafer 101 may have any geometric and/or non-geometric shape in accordance with the following description.

For a setup operation 305, a bare wafer 101 and a carrier 300 are obtained, and such bare wafer 101 is placed on carrier 300 in a molding chamber or other equipment used for molding. Carrier 300 may or may not be transparent, and thus a number of different materials may be used for carrier 300. However, coefficient of thermal expansion ("CTE") of wafer 101 and CTE of carrier 300 are at least reasonably close to one another, namely sufficiently close for semiconductor processing of both bodies together without significant warping due to differences in thermal expansion.

Carrier 300 may optionally have through holes 303 extending from a top surface 301 of carrier 300 to a bottom surface 302 thereof. Such holes 303 may be for pulling a vacuum for temporarily holding wafer 101 to carrier 300. Holes 303 may be connected to a vacuum system through an optional self-closing gasket 333, which is a part of carrier 300, such that when a vacuum pump is disconnected, such self-closing gasket 333 seals and maintains a vacuum between a substrate, such as wafer 101, and carrier 300 though one or more subsequent processing operations. Application of encapsulation or molding material, as described below in additional detail, may further seal such vacuum between wafer 101 and carrier 300 ensuring that wafer 101 and carrier 300 do not separate during such one or more subsequent processing operations. For purposes of clarity by way of example and not limitation, it shall be assumed that optional holes 303 are not used.

A bottom surface 306 of wafer 101 and top surface 301 of carrier 300 are both sufficiently flat that wafer 101 and carrier 300 are sufficiently stuck to one another or abut one another by dispersive adhesion or physisorption, namely where two materials are held together by van der Waal forces. Effectively, a vacuum may be created between surfaces 101 and 306, which is known as the Casimir Effect. Accordingly, this dispersive adhesion may be used to hold surfaces 306 and 301 in contact with one another to hold wafer 101 to carrier 300 without use of any adhesive between surfaces 306 and 301. Again, wafer 101 may be used to form one or more dies for a system-in-a-package ("SiP") or an interposer, namely generally for one or more dies used for or in D2D, W2D, or WLP interconnections for forming a 3D IC. Bottom surface 306 may be processed to provide a sufficiently planar surface, such as by CMP or other polishing, in order to provide a sufficiently flat surface for abutment to provide a sufficient vacuum. Along those lines, one or more operations associated with backside processing, such as BEOL operations for a backside, may be conducted prior to any operations associated with front side processing. Such backside processing, which may include without limitation forming an RDL and CMP on a backside, may be conducted prior to vacuum abutting such backside to a top surface 301 of carrier 300.

For bare wafer 101 and carrier 300 traveling together through BEOL, as well as FEOL processing for active die, top surface 304 of wafer 101 is a front side surface 4, and bottom surface 306 of wafer 101 is a backside surface 6. However, as previously indicated, a completely or near completely BEOL processed wafer 101 may be loaded onto carrier 300 for thinning, such as for a backside reveal as described below in additional detail, and in such an embodiment, top surface 304 of wafer 101 may be a backside surface 6. Thus, for example, wafer 101 may be thinned prior to FEOL or BEOL processing, thinned after any and all FEOL and some or all BEOL processing associated with a front side surface, or thinned after flipping over, such as for a backside reveal. Generally, for purposes of clarity and not limitation, the following description is for thinning prior to any FEOL or BEOL processing through a front side of wafer 101.

Figure 3B:
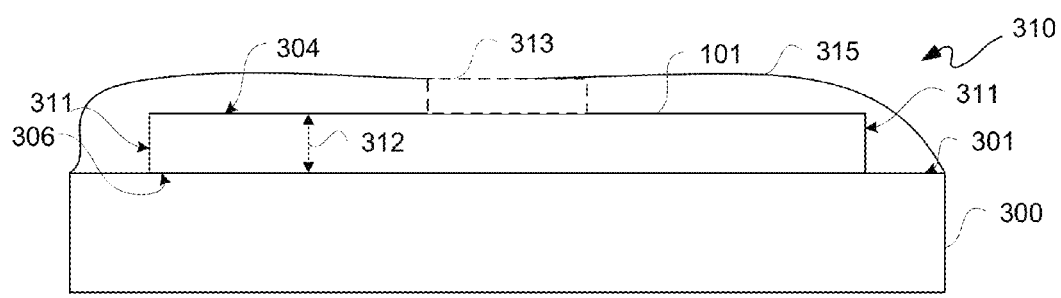
FIG. 3B is the block diagram of FIG. 3A with the addition of an encapsulation or molding material for a molding operation.

FIG. 3B is the block diagram of FIG. 3A with the addition of an encapsulation or molding material 315 for a molding operation 310. Material 315 may be an epoxy or other encapsulation or molding material used in packaging an IC. For example, an encapsulation or molding compound may be deposited using paste printing, compressive molding, transfer molding, liquid encapsulant molding, vacuum lamination, spin coating, or other suitable application. Examples of material 315 may include a polymer composite material (e.g., epoxy resin with filler), an epoxy acrylate with filler, or another polymer with filler. Material 315 may have a CTE at least reasonably near to that of wafer 101 so as to not have any significant warping, as previously described. Warpage may alternately or additionally be controlled while utilizing materials with widely varying CTE values by making carrier 300 with a significantly higher thickness than wafer 101 and associated encapsulation or molding material deposited thereon. Along those lines, material 315, carrier 300 and wafer 101 may have CTEs ranging from 2 ppm/° C. to 200 ppm/° C., while thickness of carrier 300 may be more than twice a final thickness of wafer 101, as well as a final thickness of wafer 101 and material 315 in combination.

For example, for wafer 101 a silicon wafer, an epoxy used as an underfill material between two dies may be used for material 315. Formation of reconstituted wafers may involve having completely formed die molded to an interposer coupled thereto via interconnects; and such molding technology may be used here.

In one process for making a reconstituted wafer, molding material, such as a resin epoxy for example, is left above an upper surface of a die and that such die have any and all BEOL processing completed prior to molding. Additionally, for a reconstituted wafer, surfaces of dies do not directly touch one another. Along those lines, a reconstituted wafer may not have surfaces of a carrier and a wafer directly abutting one another without use of an adhesive between a bottom surface of a wafer and a top surface of a carrier. In other words, for a reconstituted wafer there may be mechanical adhesion between a bottom surface of a wafer and a top surface of a carrier, as there is may be adhesive between such surfaces. In a process for making a reconstituted wafer, dies may be placed with their upper surfaces directly on a top surface of a carrier with an adhesive between them. A molding material may be applied over such dies and in the gaps between such dies. Polishing of this molding material, which may include thinning of such dies, may be performed. Then, such a reconstituted wafer may be flipped over such that lower surfaces of dies thereof are effectively lying on a top surface of the same or a different carrier. From this step onwards, such a reconstituted wafer may be affixed or otherwise made as whole work piece using operations as outlined in FIG. 3A and FIG. 3B for further processing, such as BEOL processing and dicing.

Material 315 may be deposited so as to cover a top surface 304, such as a front side surface 4 in this implementation, of a bare wafer 101, as well as all side surfaces 311 of wafer 101. In this exemplary implementation, for a cylindrical wafer 101, there may be just one circular side surface 311; however, in other configurations of wafer 101 there may be more than one side surface 311. Material 315 may be deposited so as to additionally cover at least an exposed portion of top surface 301 of carrier 300 bordering such side surface 311 of wafer 101. At this point, material 315 may have been deposited so as to seal a vacuum created between surfaces 306 and 301, such as previously described. Along those lines, material 315 may be sufficiently nonporous so as to seal such vacuum in place. Additionally, wafer 101 may have a thickness 312 from between surfaces 304 and 306, and material 315 may have at least such thickness around wafer 101. Thus, it should be understood that material 315 completely surrounds a sidewall 311 of wafer 101.

Optionally, a mechanical arm 313 may be used to push down on wafer 101 while resting on carrier 300. Carrier 300 may be on a chuck or other platform (not shown) during a molding operation 310. Mechanical arm 313 may leave a hole in molding material 315 along a portion of top surface 304; however, as an upper portion of molding material 315 is subsequently removed, such hole may have no effect.

Figure 3C:
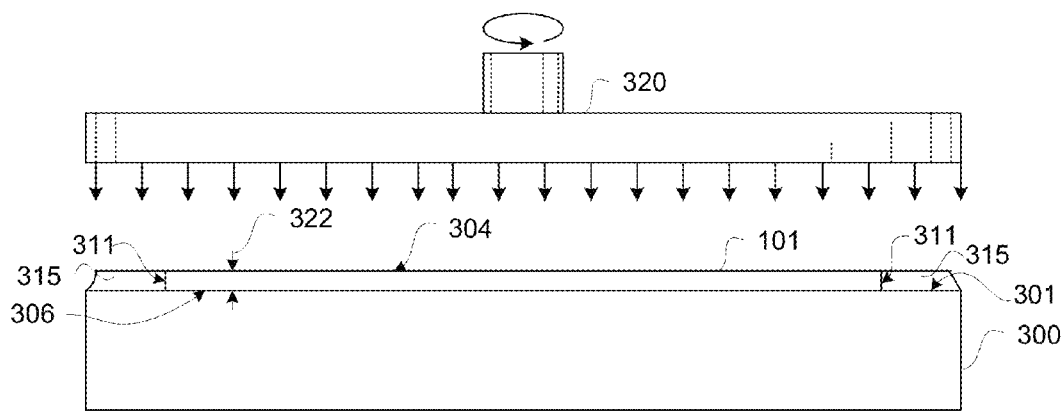
FIG. 3C is the block diagram of FIG. 3B after a wafer thinning operation.

FIG. 3C is the block diagram of FIG. 3B after a wafer thinning operation 320. Wafer thinning operation 320 may include one or more of mechanical grinding, mechanical lapping, and/or chemical mechanical polishing ("CMP"). While wet and/or dry etching may be used, such forms of material removal may unduly add cost to processing. Along those lines, an upper portion of material 315 may be more rapidly removed to expose top surface 304 of wafer 101, prior to a more controlled lapping of wafer 101 for purposes of thinning. More of material 315 along a sidewall perimeter of wafer 101 may be removed with thinning of wafer 101.

After a wafer thinning operation 320, portions of material 315 and wafer 101 may be removed, and portions of material 315 and wafer 101 may remain. With respect to material 315 removed, such material 315 above a top surface 304 of thinned wafer 101 may be removed. Thus, for example, a front side surface 4 of a thinned bare wafer 101 may be exposed after thinning operation 320 for FEOL and BEOL processing. After thinning, wafer 101 may have a thickness 322, which is substantially thinner than thickness 312, namely an original thickness of a bare wafer 101. Additionally, material 315 may have a maximum thickness equivalent to that of thickness 322 of thinned wafer 101. Wafer 101 may have a thickness 322 from between surfaces 304 and 306 after thinning, and material 315 may have a maximum of such thickness around wafer 101. Thus, it should be understood that material 315 after thinning still completely surrounds a sidewall 311 of wafer 101. However, material 315 may be thinned so as to be below top surface 304 in other implementations. Thickness 322 after a thinning operation at 320 of wafer 101 may be approximately 300 micron or less thick.

Figures 1, 3E:
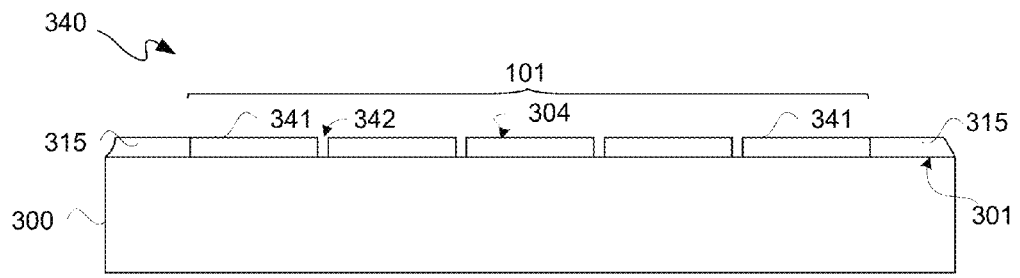

FIG. 3D-1 is a block diagram depicting a top view of wafer 101 after thinning at thinning operation 320 of FIG. 3C. With simultaneous reference to FIGS. 3A through 3C, and 3D-1, FIG. 3D-1 is further described. With respect to material 315 remaining, such material 315 may form a ring or other border 330 surrounding wafer 101. Additionally, wafer 101 may have a notch or removed portion (not shown) for purposes of alignment, such as is known for example.

In this example, material 315 remaining completely covers a top surface 301 of carrier 300 not already covered by wafer 101. According, thinned wafer 101 in this example has front side surface 4 for top surface 304, which is re-exposed after wafer thinning operation 320 by removing an upper portion of molding material 315, leaving a lower portion of molding material 315 remaining on top surface 301 of carrier 300.

During thinning operation 320, material 315 remaining restrains wafer 101 from lateral movement, namely movement in horizontal directions such as x- and y-directions 398 and 399 for example, respectively. Movement of wafer 101 in a vertical direction or z-direction is restrained by molding material 315 sealing a vacuum between abutting surfaces of wafer 101 and carrier 300. As described above, for a bare wafer 101, such a bottom surface 306 abutting a top surface of carrier 300 is a backside surface 6. However, for a wafer 101 having had all BEOL completed before being placed on carrier 300 during setup operation 305, a bottom surface 306 may be a front side surface 4 of wafer 101 for abutting a top surface 301 of carrier 300, and so a back side reveal operation may be performed by a thinning operation 320.

Figures 2, 3E:
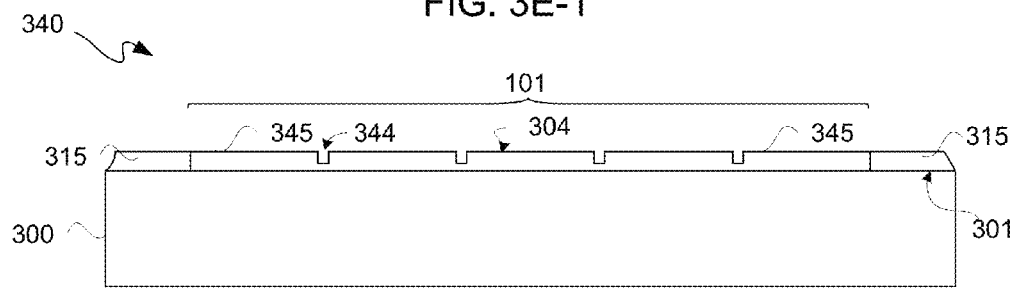

FIG. 3D-2 is a block diagram depicting another top view of wafer 101 after thinning at thinning operation 320 of FIG. 3C. With simultaneous reference to FIGS. 3A through 3C, and 3D-2, FIG. 3D-2 is further described though generally only for differences with respect to FIGS. 3D-1 for purposes of clarity and not limitation.

In this top view, molding material 315 does not completely cover top surface 301 of carrier 300 not already covered by wafer 101. Again, in this implementation, thinned wafer 101 has front side surface 4 for top surface 304 re-exposed after wafer thinning operation 320 which removes an upper portion of molding material 315, leaving a lower portion thereof on top surface 301 of carrier 300.

For a bare wafer 101, such wafer 101 and carrier 300 may travel together for processing such as BEOL processing, and FEOL processing as applicable. FIG. 3E-1 is a block diagram depicting a wafer or substrate 101 after having completed BEOL processing and dicing for a dicing operation 340. Dicing operation 340 may be a conventional dicing operation for forming an x- and y-grid of grooves, such as either x- or y-grooves 342 to release dies or dice 341. Grooves 342 may extend from top surface 304 down to top surface 301 of carrier 300. Optionally, wafer 101 and carrier 300 abutting one another as described herein may optionally be placed into a chamber with a vacuum for dicing.

FIG. 3E-2 is a block diagram depicting a wafer or substrate 101 after completed BEOL processing and partial dicing for a dicing operation 340. Dicing operation 340 may be a conventional dicing operation for forming an x- and y-grid of grooves, such as either x- or y-grooves 344. Grooves 344 may extend from top surface 304 down toward top surface 301 of carrier 300 without completely extending through thickness of wafer 101. Accordingly, wafer 101 with grooves 344 may be removed from carrier 300 for a subsequent backside grind or other removal of material from a backside surface 6 or bottom surface 306 for releasing dies 345.

To recapitulate with simultaneous reference to FIGS. 3A through 3E-2, a bottom surface 306 of a substrate 101 is disposed on a top surface 301 of a carrier or support platform 300. Such bottom surface may be a backside surface 6 or a front side surface 4 of a substrate 101. Such a bottom surface 306 of substrate 101 abuts such a top surface 301 of support platform 300 without any adhesive between such surfaces 306 and 301. A material 315 is disposed around substrate 101 and on top surface 301 of support platform 300. Material 315 is in contact with a side surface 311 of substrate 101 so as to completely seal an interface as between bottom surface 306 of substrate 101 and top surface 301 of support platform 300 to retain abutment of top surface 301 and bottom surface 306. A maximum thickness of material 315 in a vertical direction orthogonal to top surface 301 may be equivalent to thickness of substrate 101

Figure 4:
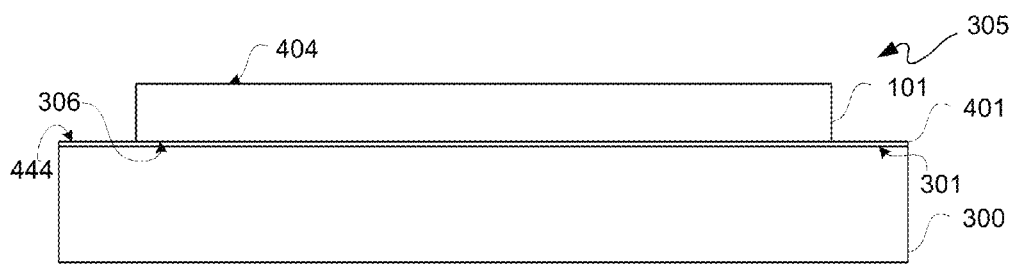
FIG. 4 is the block diagram of FIG. 3A, but with a membrane.

FIG. 4 is the block diagram of FIG. 3A, but with a membrane 401. In this implementation of a setup operation 305, a membrane 401 is disposed on top surface 301 of carrier 300 prior to disposition of wafer 101 thereon. Membrane 401 may be a thin film, such as a polyimide or other thin polymer film, for having dies on film for dicing, such as at dicing operation 340 of FIG. 3E-1, to protect carrier 300 from being damaged due to dicing.

Membrane 401 may be disposed at least between bottom surface 306 of wafer 101 and a corresponding top surface portion of top surface 301 of carrier 300 without any adhesive for attachment to bottom surface 306. Membrane 401 may be coupled to such bottom surface 306 of wafer 101 with a vacuum between membrane 401 and such bottom surface. For a molding operation 310 of FIG. 3B, material 315 may be disposed around wafer 101 and on a top surface 444 of membrane 401. After a thinning operation 320 of FIG. 3C, material 315 may seal an interface as between bottom surface 306 of wafer 101 and top surface 444 of membrane 401 to retain abutment of bottom surface 306 to membrane 401 and carrier 300 in combination.

Figure 5A:
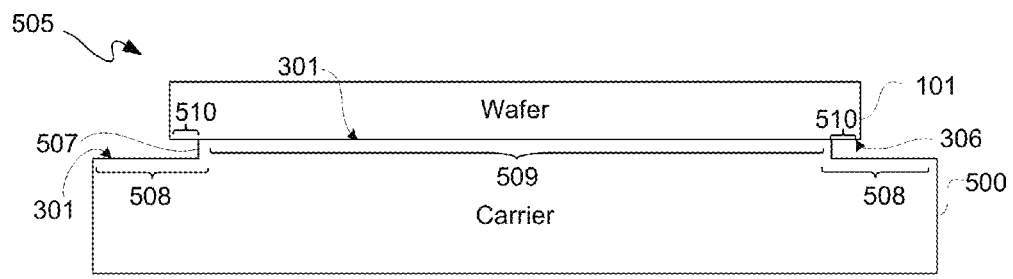
FIG. 5A is a block diagram depicting a side view of an exemplary wafer and support platform ("carrier") for a setup operation.

FIG. 5A is a block diagram depicting a side view of an exemplary wafer 101 and support platform ("carrier") 500 for a setup operation 505. As setup operation 505 of FIG. 5A is similar to setup operation 305 of FIG. 3A, generally only the differences are described below for purposes of clarity and not limitation.

Support platform 500 includes a raised step 507 along top surface 301. More particularly, support platform 500 includes an inner surface portion 509 and an outer or perimeter edge portion 508 of top surface 301. Bottom surface 306 of wafer 101 abuts inner surface portion 509 of top surface 301 of carrier 500 associated with raised step 507 without any adhesive between an inner surface portion 509 of top surface 301 and bottom surface 306.

Figure 5B:
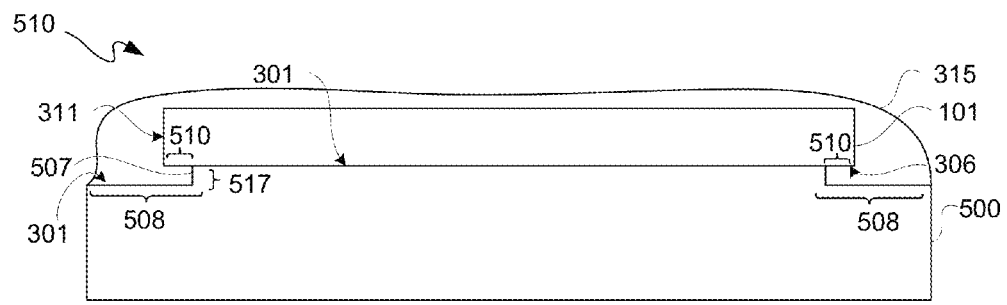
FIG. 5B is the block diagram of FIG. 5A with the addition of an encapsulation or molding material for a molding operation.

FIG. 5B is the block diagram of FIG. 5A with the addition of an encapsulation or molding material 315 for a molding operation 510. As molding operation 510 of FIG. 5B is similar to molding operation 310 of FIG. 3B, generally only the differences are described below for purposes of clarity and not limitation.

Material 315 is disposed on top of and around wafer 101, as well as on an exposed portion of top surface 301 of carrier 500. More particularly, material 315 is deposited on perimeter edge portion 508 of top surface 301 of carrier 500, including a side surface 517 thereof, and underneath perimeter edge portion 510 of bottom surface 306 of wafer 101 that extends or juts out from perimeter edge portion 508 of top surface 301 associated with raised step 507. Material 315 is in contact with a side surface 311 of wafer 101 and a perimeter edge portion 510 of bottom surface 306 of wafer 101, where such perimeter edge portion 510 extends or juts out from step 507 so as to be cantilevered. Thus, material 315 completely seals the interface as between bottom surface 306 of wafer 101 and inner surface portion 509 of top surface 301 of carrier 500 associated with raised step 507 to retain abutment between top surface 301 and bottom surface 306.

Figure 5C:
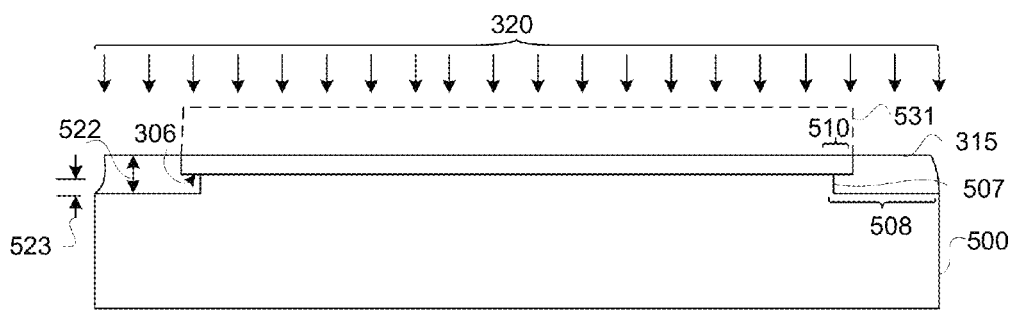
FIG. 5C is the block diagram of FIG. 5B after a wafer thinning operation.

FIG. 5C is the block diagram of FIG. 5B after a wafer thinning operation 320. Wafer thinning operation 320 of FIG. 5B is the same as that of FIG. 3C, except that material 315 remaining after such wafer thinning extends underneath perimeter edge portion 510 of bottom surface 306 of wafer 101 and has a maximum thickness 522 in a vertical direction orthogonally from perimeter edge portion 508. Thickness 522 is thickness 322 of wafer 101 after thinning plus thickness or height 523 of step 507. Additionally, optionally, another substrate 531, which may be part of a completed package, may be attached or coupled to thinned wafer 101, namely a wafer-level attachment. Such attachment or coupling of substrate 531 may provide addition structural support for die of wafer 101 after dicing for removal from carrier 500. Along those lines, substrate 531 may be diced along with wafer 101. Optionally, die from dicing of substrate 531 may be coupled to one or more to be diced die of wafer 101 for package- or die-level coupling or attachment to provide such die support. Thus, for example for wafer 101 or substrate 531 an interposer, processed dies of wafer 101 may be coupled to other processed dies through flip-chip micro bumps for example prior to dicing. Optionally, for wafer 101 having through substrate via structures, such as TSVs for example as previously described, thinning operation 320 may be a backside reveal. Along those lines, wafer 101 may be processed with access through a front side, which may be coupled to carrier 500 as previously described, and then prior to thinning operation 320, such wafer 101 may be decoupled from such carrier 500 or otherwise flipped over and coupled to such carrier or another carrier 500 as previously described herein to reveal such backside, and then such inverted wafer 101 may be thinned with thinning operation 320 as part of a backside reveal. However, for purposes of clarity by way of example and not limitation, substrate 531 or dies thereof is or are not illustratively depicted in FIG. 5D for a dicing operation, though optionally same may be present.

Figure 5D:
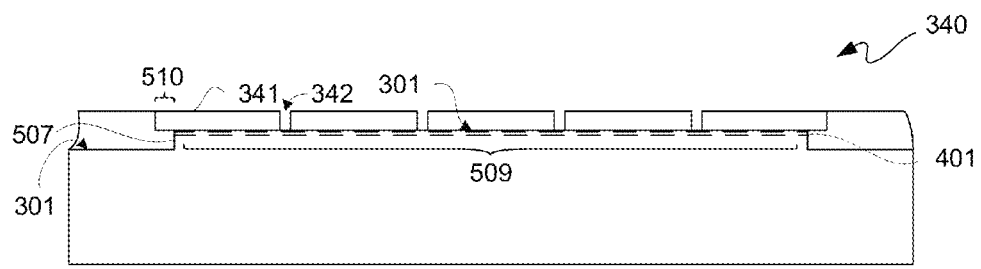
FIG. 5D is a block diagram depicting a wafer or substrate after having completed BEOL processing and dicing for a dicing operation.

FIG. 5D is a block diagram depicting a wafer or substrate 101 after having completed BEOL processing and dicing for a dicing operation 340. Dicing operation 340 of FIG. 5D is the same as that of FIG. 3E-1. Furthermore, though not illustratively depicted, a dicing operation 340 of FIG. 3E-2 may be used for dicing operation 340 of FIG. 5D. In dicing operation 340 of FIG. 5D, an optional membrane 401 may be placed on an inner surface portion 509 of top surface 301 of step 507, such as previously described with reference to FIG. 4 though for carrier 300. Even though dies 341 are illustratively depicted as including perimeter edge portion 510, for some processed wafers 101 perimeter edge portion 510 may not be used.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method, comprising:
   placing a substrate on a top surface of a support platform;
   wherein a bottom surface of the substrate abuts the top surface of the support platform after placement without adhesive between the bottom surface and the top surface;
   depositing a material over and around the substrate and on the top surface of the support platform;
   wherein the material is in contact with a side surface of the substrate to completely seal an interface as between the bottom surface of the substrate and the top surface of the support platform to retain abutment of the top surface and the bottom surface without adhesive therebetween;
   removing an upper portion of the material;
   thinning the substrate including removing more of the material;
   back-end-of-line processing the substrate including forming one or more inter-level dielectrics and one or more levels of metallization; and
   dicing the substrate to provide dies.

2. The method according to claim 1, further comprising:
   placing a membrane on the top surface of the support platform prior to placement of the substrate;
   wherein the bottom surface of the substrate abuts the membrane which abuts the top surface of the support platform.

3. The method according to claim 1, wherein:
   the support platform includes a raised step along the top surface;
   the material is disposed around the substrate, on the top surface of the support platform and underneath a perimeter edge portion of the bottom surface of the substrate that extends out from a portion of the top surface associated with the raised step;
   the material is in contact with the side surface of the substrate and the perimeter edge portion of the bottom surface of the substrate to completely seal the interface as between the bottom surface of the substrate and the portion of the top surface of the support platform associated with the raised step to retain abutment of the top surface and the bottom surface.

4. The method according to claim 1, wherein maximum thickness of the material in a vertical direction orthogonal to the top surface is equivalent to thickness of the substrate.

5. The method according to claim 4, wherein the material is an encapsulation material.

6. The method according to claim 4, wherein thickness of the support platform is more than twice that of a final thickness of the substrate.

7. The method according to claim 4, wherein:
   the substrate is a bare wafer when placed on the top surface of the support platform; and
   the bottom surface of the bare wafer is a backside surface.

8. The method according to claim 4, wherein:
   the substrate is a wafer having had the back-end-of-line processing prior to placement on the top surface of the support platform; and
   the bottom surface of the wafer is a front side surface.

* * * * *